(12) United States Patent
Feldmann

(10) Patent No.: US 7,776,122 B2
(45) Date of Patent: Aug. 17, 2010

(54) FILTER SYSTEM

(75) Inventor: Roland Feldmann, Meiningen (DE)

(73) Assignee: ADVA AG Optical Networking, Meiningen (DE)

( * ) Notice: Subject to any disclaimer, the term of this patent is extended or adjusted under 35 U.S.C. 154(b) by 498 days.

(21) Appl. No.: 11/689,368

(22) Filed: Mar. 21, 2007

(65) Prior Publication Data
US 2007/0220854 A1  Sep. 27, 2007

(30) Foreign Application Priority Data
Mar. 22, 2006 (DE) .................. 10 2006 013 204

(51) Int. Cl.
*B01D 46/00* (2006.01)
(52) U.S. Cl. .............. 55/481; 55/422; 55/495; 55/506; 55/DIG. 31
(58) Field of Classification Search ........... 55/478, 55/480, 481, 490, 493, 495, 496, 422, 497, 55/506, DIG. 31
See application file for complete search history.

(56) References Cited

U.S. PATENT DOCUMENTS

| | | | |
|---|---|---|---|
| 5,120,919 A * | 6/1992 | Bruges | 200/289 |
| 5,611,922 A | 3/1997 | Stene | |
| 6,310,770 B1 | 10/2001 | Negishi | |
| 6,585,792 B2 * | 7/2003 | Schneider et al. | 55/481 |
| 7,312,990 B2 * | 12/2007 | Mangold | 361/695 |
| 7,364,602 B2 * | 4/2008 | Wu et al. | 55/493 |
| 7,524,362 B2 * | 4/2009 | Wu et al. | 96/15 |
| 2005/0204713 A1 | 9/2005 | Wu et al. | |
| 2005/0204922 A1 * | 9/2005 | Wu et al. | 96/66 |

FOREIGN PATENT DOCUMENTS

| | | |
|---|---|---|
| CH | 448 693 A | 4/1968 |
| DE | 75 00 977 | 7/1975 |
| DE | 28 00 513 A1 | 7/1978 |
| DE | 40 13 645 A1 | 5/1991 |
| DE | 198 17 387 A1 | 10/1999 |
| DE | 10 2005 034 987 A1 | 2/2007 |
| WO | WO 00/74818 A1 | 12/2000 |

OTHER PUBLICATIONS

Machine translation of German Publication No. DE 4013645, published May 8, 1991.*
Extended European Search Report for European Apppplication No. 07005933.2-1213, Jul. 28, 2008, 8 Pages.
Examination Report for German Application No. 10 2006 013 204. 1-23, Feb. 27, 2007, 3 Pages.

* cited by examiner

*Primary Examiner*—Michael A Marcheschi
*Assistant Examiner*—Robert A Clemente
(74) *Attorney, Agent, or Firm*—The Culbertson Group, P.C.

(57) ABSTRACT

The invention pertains to a filter system, particularly for cleaning the air of a switchgear cabinet to be ventilated, wherein a filter housing can be inserted into an insertion shaft in a first direction and is subjected to a motion perpendicular to the first inserting direction during the course of the inserting motion in order to reach the desired end position of the filter housing.

19 Claims, 3 Drawing Sheets

FILTER SYSTEM

TECHNICAL FIELD OF THE INVENTION

The present invention pertains to a filter system, particularly for cleaning the air of a switchgear cabinet or subrack carrier to be ventilated, as well as to a switchgear cabinet.

BACKGROUND OF THE INVENTION

In switchgear cabinets or subrack carrier housings known from the state of the art, the internal components need to be cooled with air currents. In order to simultaneously prevent soiling of the respective interior, the air is usually cleaned by means of a filter element before it is admitted into the housing.

The insertion and removal of the filter elements has proved quite problematic in practical applications. The filter elements need to be exchangeable and cover a ventilation opening in the switchgear cabinet at a location that is difficult to access. When changing the filter element, it also needs to be taken into account that cables, optical waveguides or other components in the switchgear cabinet or in its immediate vicinity cannot form an obstruction or be damaged. In addition, cable ducts frequently extend to the actual switchgear cabinet underneath or laterally thereof such that the insertion of the filter elements, in particular, into the preferred bottom region of the housing is quite complicated and associated with the risk of damaging the switchgear cabinet components.

DE 198 17 387 B2 discloses an air-conditioning system for a switchgear cabinet, in which the filter element is arranged in an air duct such that it is inclined relative to the vertical by a certain angle, wherein the filter element is fixed in position by means of a spring element. The disadvantage of this embodiment can be seen in that the arrangement of a filter element requires much space. The exchange of the filter element is also still a relatively complicated procedure and only possible if direct access to the ventilation channel is provided.

DE 7500977 discloses an air filter housing with a tensioning device that serves for accommodating filter cells for cleaning air or gases. In this case, the filter elements can be pressed against contact surfaces with the aid of a spindle. However, the arrangement and the exchange of the filter elements are still quite complicated.

CH 448 693 discloses a pressing device for tightly inserting exchangeable filters into exhaust air ducts. The filter elements are moved into their pressing position and disengaged therefrom by means of a toggle lever mechanism. This variation has a complicated constructive design and requires much structural space (particularly for the actuation).

Consequently, the invention is based on the objective of developing a filter system, particularly for switchgear cabinets or subrack carriers, in which the filter element(s) can be easily exchanged without affecting or damaging external or internal components of the switchgear cabinet or subrack carrier and without noteworthy modifications to the switchgear cabinet design.

SUMMARY OF THE INVENTION

The invention is based on the notion that a filter element can be replaced and exchanged through an insertion shaft. The insertion shaft is advantageously positioned underneath or laterally of the switchgear cabinet or subrack carrier such that cable ducts or the like do not form an obstruction during the exchange. In order to assume an end position, in which the filter element should essentially form a tight seal of the ventilation opening in the switchgear cabinet or subrack carrier, the invention provides means for moving or raising the filter element or a filter housing carrying the filter element by a certain distance perpendicular to the inserting direction. According to the invention, the filter element therefore is guided along a two-dimensional path although the actuation realized by subjecting the filter element to thrust or tension essentially takes place one-dimensionally, namely in the inserting direction of the insertion shaft. Due to these measures, the filter element can be advantageously inserted in a very space-saving fashion and moved into its end position that is situated, for example, behind cable ducts.

The invention is described in greater detail below with reference to a switchgear cabinet, wherein such a switchgear cabinet merely represents one possible application and should not be interpreted, in particular, in a restrictive sense.

One of the simplest embodiments of the filter system features a filter housing that is designed to accommodate a preferably mat-shaped filter element. The filter housing stabilizes the filter element in its position and maintains its shape—for example against suction pressure. According to the invention, the filter housing can be placed against a ventilation opening provided in the switchgear cabinet for this purpose in an essentially sealed fashion covering the ventilation opening. In this end position, the filter housing with the filter element lying therein seals the ventilation opening such that the air drawn into the region of the switchgear cabinet flows through the filter element and is cleaned during this process.

According to the invention, the filter housing can be inserted through an insertion shaft. In this case, the filter housing can be moved along this shaft by means of a thrust element through which a first thrust may be applied, wherein this motion should take place in a first, usually lateral direction X. In response to the first thrust, the filter housing to be inserted assumes an initial inserted position that, referred to the X-direction, lies relatively close to the desired end position before the displacement in the Y-direction (that is, the second direction) takes place. The insertion shaft is advantageously realized in such a way that the filter housing can be pulled out toward the front, e.g., from underneath the switchgear cabinet, by subjecting it to thrust or tension and reinserted along the same path. The shaft may be arranged underneath the switchgear cabinet or any cable ducts and therefore does not impair the function of the switchgear cabinet.

In order to transfer the filter housing from the initial inserted position into the end position, the invention provides transverse displacement means for displacing at least part of the filter housing beyond the initial inserted position, namely in a second direction Y that extends perpendicular to the first direction X while continuing to subject the filter housing to thrust, that is, an additional thrust in the first direction X. This makes it possible to displace the filter housing vertically upward by a certain distance—e.g., after it was horizontally pushed through underneath the cable duct, and to thusly press the filter housing against the ventilation opening in the bottom of the switchgear cabinet. The transverse displacement means are realized in such a way that the motion in the Y-direction takes place in a positively driven fashion and results from the thrust exerted upon the filter housing exclusively in the X-direction. This two-dimensional inserting motion of the filter housing realized by subjecting the filter housing to essentially one-dimensional thrust or tension makes it possible to realize a space-saving filter system. This furthermore should make it possible to "engage" the filter housing behind obstructing components during the course of the insertion such that installation space can be advantageously utilized. In contrast to the state of the art, for example, removal or displacement of cable ducts situated on the front edge or slightly underneath the switchgear cabinet is no longer required in order to exchange the filter and to position a filter housing against a ventilation opening in the switchgear cabinet from the bottom.

This represents a significant advantage, particularly with respect to fiber-optic cables because these cables are extremely sensitive to being touched. Consequently, the risk of signal distortions or data loss is advantageously avoided with the inventive filter system.

According to another advantageous embodiment of the invention, the filter element with its filter housing has an essentially planar shape. The end position is also arranged approximately parallel to the initial inserted position. This means that the filter housing can essentially be displaced into the end position in the form of a parallel displacement from its initial inserted position. This can be achieved with relatively simple mechanical means, for example, identically shaped ramps for raising the filter housing from the initial inserted position into the end position.

The filter housing can also be displaced from the initial inserted position into the end position by means of a translatory motion only, wherein this translatory motion can also be realized with relatively simple mechanical means. The filter housing may be coupled, in particular, to the thrust element by means of adjusting bars such that the filter housing is only able to carry out a translatory pivoting motion relative to the adjusting bar. However, the translatory motion not only enables displacement of the filter housing in the Y-direction relative to the inserting direction X. The filter housing is also able to carry out a pivoting motion such that it can essentially be pivoted back into the plane of the direction of thrust X in order to be subsequently pulled out along this plane and exchanged.

According to another advantageous embodiment of the invention, the transverse displacement means for acting upon the filter housing in the Y-direction feature at least one guide element that is realized such that the filter housing is essentially moved from the initial inserted position into the end position in the form of a translatory motion. The guide element may be simply realized in the form of a ramp that is situated beyond the initial inserted position in the direction of thrust, the X-direction. As soon as the filter housing is inserted into the insertion shaft beyond the initial inserted position, its front edge (leading edge) cooperates with this guide element such that it is raised by a certain distance in the Y-direction. If the translatory coupling between the filter housing and the thrust element is realized accordingly, the entire filter housing is raised from the plane of insertion and moved into its end position on the ventilation opening of the switchgear cabinet during the course of a parallel displacement.

However, it would also be conceivable to displace the filter housing from its initial inserted position into its end position in the form of a non-translatory motion. For example, the filter housing may be simply suspended on the thrust element such that it can be pivoted relative thereto. The filter housing is also moved into the end position in connection with a guide element realized in the form of a ramp in this case, wherein this takes place during the course of a non-translatory pivoting motion (as described below with reference to FIG. 2).

According to another embodiment of the invention, the motion of the filter housing in the X-direction is limited by a stop. This ensures that the filter housing exactly assumes the desired X-position in its end position, wherein this stop furthermore affects the pivoting motion of the filter housing relative to the thrust element and thusly ensures that the filter housing is also exactly positioned in the Y-direction (contact pressure).

According to another advantageous embodiment of the invention, the filter housing and/or the thrust element can be locked in position after the filter housing has assumed the end position. The locking arrangement may be realized in the form of a simple ratchet mechanism that can be manually disengaged that, for example, fixes the thrust element in the insertion shaft in the inserted state. The locking arrangement ensures that the filter housing does not autonomously leave its end position such that the filter function is ensured at all times. A ratchet mechanism that can be manually disengaged furthermore makes it possible to easily exchange the filter housing.

According to another advantageous embodiment of the invention, the width of the insertion shaft in the Y-direction is smaller than the distance between the initial inserted position and the end position in this direction. This means that the filter housing can be inserted, for example, underneath the switchgear cabinet along an insertion shaft with a relatively flat structural height and then displaced by a certain distance from the thusly assumed initial inserted position, namely in the Y-direction that extends perpendicular to the inserting direction X, wherein this distance exceeds the width of the insertion shaft. Although only a relatively flat insertion slot is required—for example, underneath the switchgear cabinet—in order to insert the filter housing, the filter housing can be deflected within the insertion shaft in the Y-direction by a distance that significantly exceeds the height of the insertion shaft. Consequently, the housing can be easily and reliably displaced and pressed in the Y-direction, wherein this motion is derived from the thrust exerted by the thrust element exclusively in the X-direction.

A switchgear cabinet or subrack carrier housing is also protected by a filter system according to one of the above-described embodiments. A particularly advantageous design of the switchgear cabinet is realized if the filter system can be inserted into an insertion shaft underneath the cabinet housing. This bottom region is easily accessible through an insertion shaft that extends toward the front side of the switchgear cabinet. Several switchgear cabinets of this type also could be easily arranged directly adjacent to one another. The ability to operate the thrust element without tools makes it possible to quickly and easily exchange the filter element(s) or even the complete units consisting of filter housings and filter elements.

The filter system can be advantageously serviced from the front side, namely also in the operative state of the switchgear cabinet. The low structural height furthermore makes it possible to realize a particularly compact and cost-efficient design that can be easily handled.

These and other advantages and features of the invention will be apparent from the following description of the preferred embodiments, considered along with the accompanying drawings.

DESCRIPTION OF PREFERRED EMBODIMENTS

Figure 1:
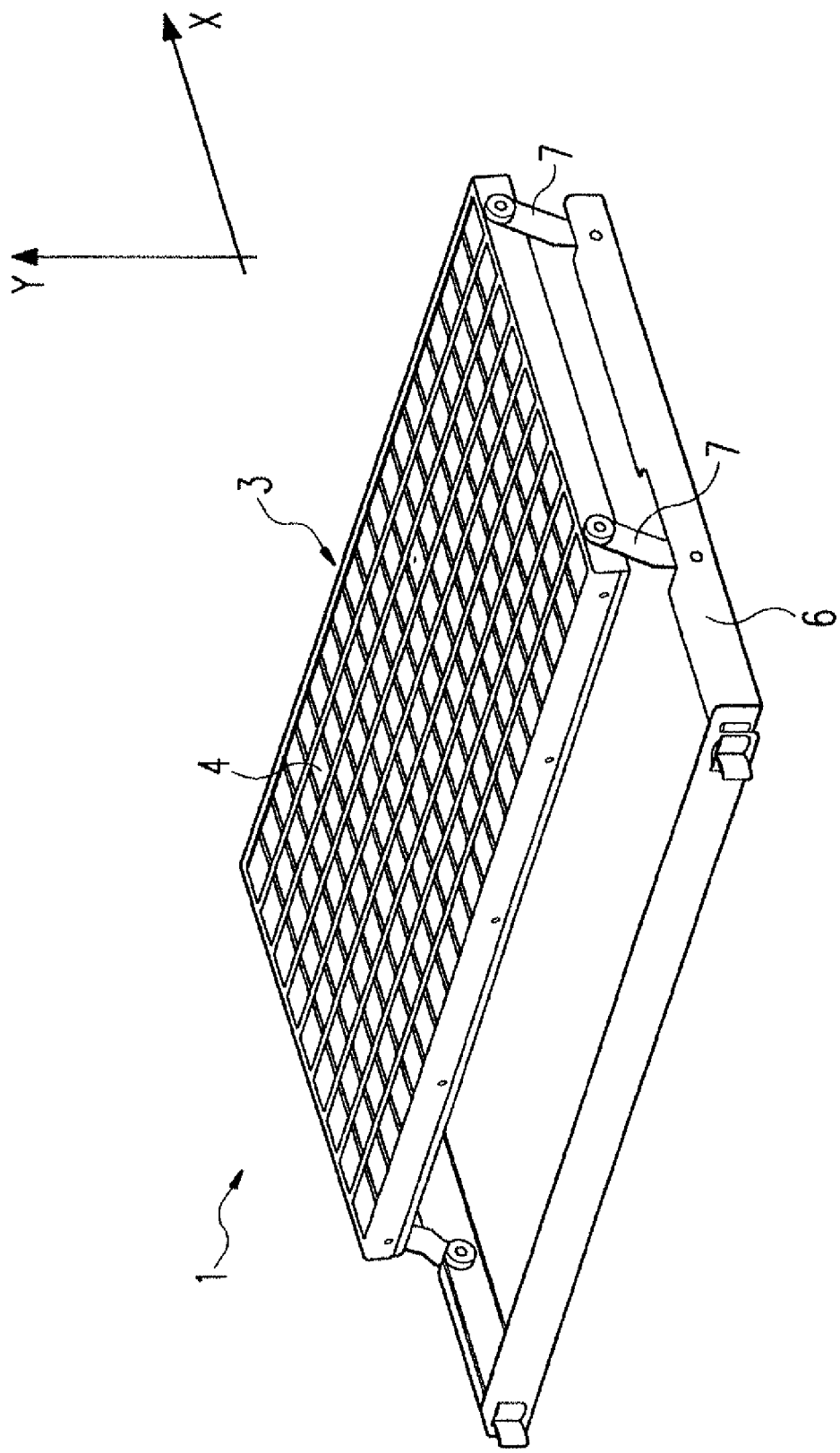
FIG. 1 shows a schematic perspective representation of parts of the filter system.

FIG. 1 shows part of a filter system 1. It comprises a thrust element 6 that can be operated very easily on the front side by means of a cross bar. A filter housing 3 designed for accommodating a filter element 4 is coupled to the thrust element 6 by means of four adjusting bars 7. As indicated in FIG. 1, two adjusting bars 7 are spaced apart at a leading edge of filter housing 3 while the remaining two adjustment bars 7 are space apart at a trailing edge of the filter housing 3. Each adjusting bar 7 is pivotally connected at one end to filter housing 3 and pivotally connected at the opposite end to thrust element 6.

The filter housing 3 can be pivoted relative to the thrust element 6 during the course of the translatory motion and, in particular, pivoted back into the plane that is essentially defined by the rectangular shape of the thrust elements 6. In this pivoted position, the thrust element 6 can be inserted into the insertion shaft in the X-direction together with the filter housing 3. The filter element 4 of the filter housing 3 can be easily exchanged outside the insertion shaft.

Figure 2:
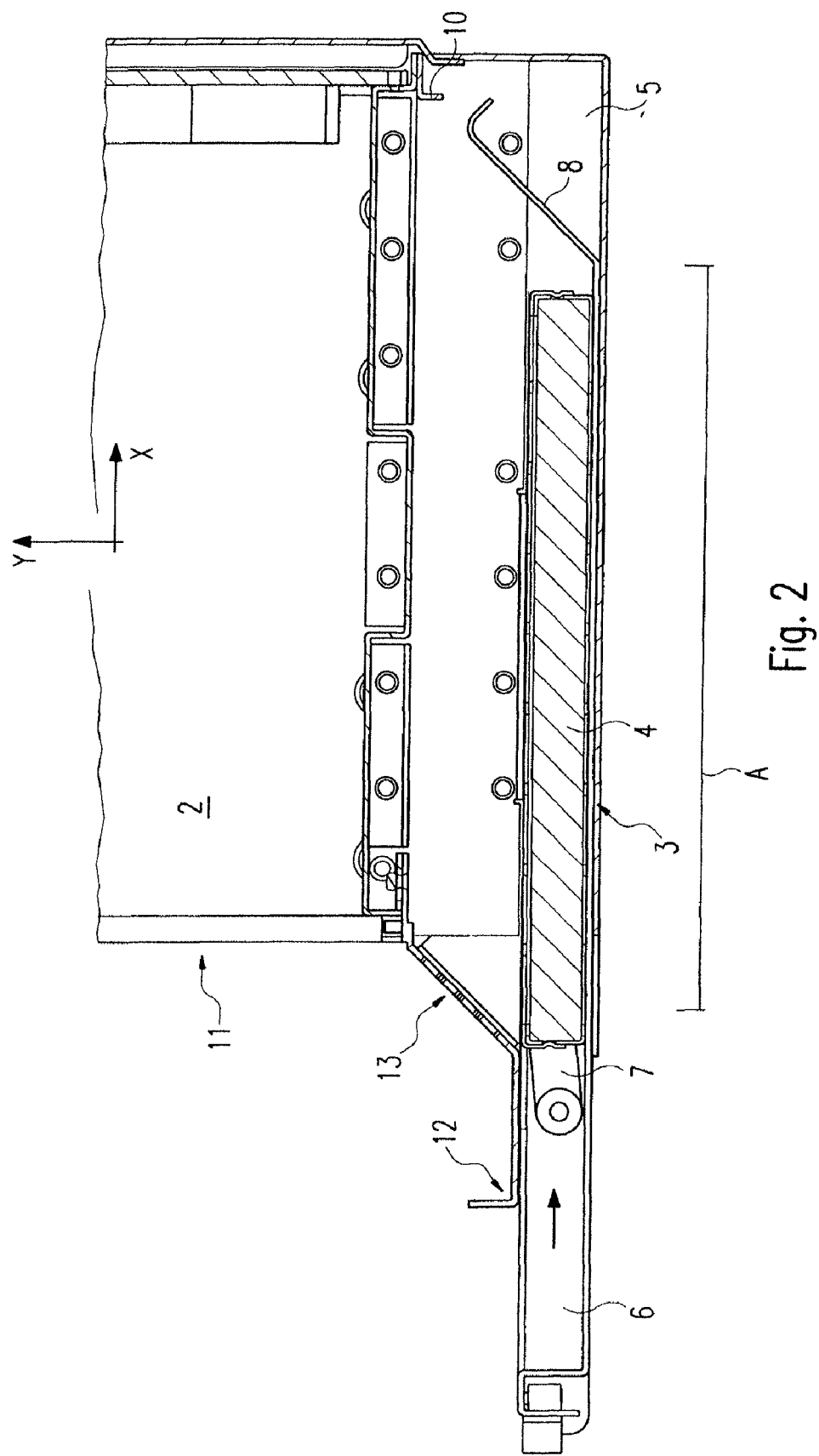
FIG. 2 is a section view showing a portion of an enclosure to be ventilated and also showing the filter system with the filter housing approaching the initial inserted position.

FIG. 2 shows a schematic side view of the lower section of an electric switchgear cabinet 2. An insertion shaft 5 essentially extends from the left toward the right underneath the switchgear cabinet 2 and is accessible from underneath the front side 11 of the switchgear cabinet. The thrust element 6 with the filter housing 3 coupled thereto is inserted into the insertion shaft 5 and displaced by a certain distance in the direction of the rear wall of the switchgear cabinet or in direction X, respectively.

The filter housing 3 with the filter element 4 lying therein is illustrated in FIG. 2 shortly before it assumes an initial inserted position A. The filter housing 3 assumes the initial inserted position A as the thrust element 6 continues to exert a first thrust thereupon in the direction of the arrow or direction X, respectively.

The initial inserted position A is limited in inserting direction X by a guide element 8 that extends in direction Y by a certain distance. The guide element 8 guides the front edge of the filter housing 3 upward in the direction of an end position B that is not illustrated in FIG. 2 by a certain distance as an additional thrust is exerted upon the filter housing 3. If the filter housing 3 is coupled such that it is able to carry out a translatory motion relative to the thrust element 6, the entire filter housing 3 acted upon by the guide element 8 is raised essentially parallel to inserting direction X and ultimately reaches the underside of the switchgear cabinet 2 or the ventilation opening situated at this location, respectively. However, if the filter housing 3 is not coupled to the thrust element 6 such that it carries out a translatory motion, but rather, for example, is coupled to an adjusting bar 7 in the form of a simple articulated connection, the guide element 8 initially raises only the front or leading edge of the filter housing 3 in direction Y. In this case, the filter housing 3 is initially inclined relative to the inserting direction X by a certain distance until its front or leading edge ultimately contacts the stop 10. As thrust continues to be exerted, the edge (trailing edge) of the filter housing 3 that points toward the front wall 11 of the switchgear cabinet is ultimately also raised out of the plane of insertion by the front adjusting bars 7 and is pressed upward in the Y-direction against the ventilation opening of the switchgear cabinet 2 and into the desired end position. The cable duct 12 advantageously remains stationary such that the cable extending therein is reliably protected. Fresh air can be taken in, in particular, through the air inlet 13.

Figure 3:
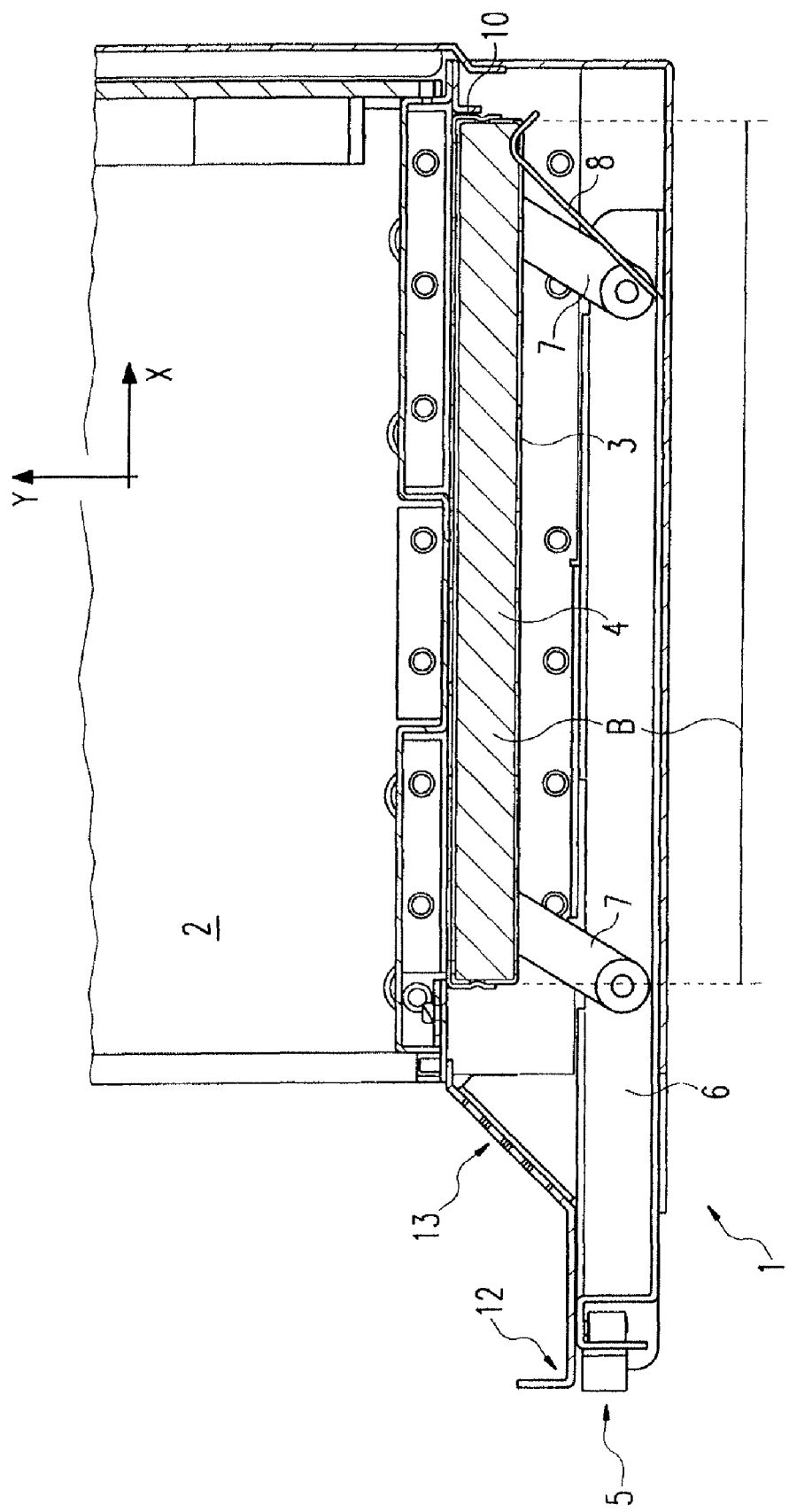
FIG. 3 is a section view similar to that shown in FIG. 2, but with the filter housing situated in the end position.

FIG. 3 shows the filter housing 3 with the filter element in the desired end position B. The end position B is upwardly offset relative to the plane of insertion in the Y-direction by a certain distance. One can also ascertain that the filter housing 3 (that is coupled to the thrust element 6 in a translatory fashion in this case) is fixed in the X-direction and the Y-direction by the guide element 8 and the stop 10. The thrust element 6 is secured within the insertion shaft 5 by means of a locking mechanism that is not illustrated in detail such that the filter housing 3 cannot autonomously leave its end position B.

When the thrust element 6 is pulled out of the insertion shaft 5 in the opposite X-direction, the filter housing 3 is initially lowered from the end position B in a reversed motion sequence and assumes the inserting position A (FIG. 2). As tension continues to be exerted, the filter element 3 that now essentially lies completely in the plane of the inserting direction X or the insertion shaft 5, respectively, can be completely pulled out toward the left such that the filter element 4 can be exchanged.

As used herein, whether in the above description or the following claims, the terms "comprising," "including," "carrying," "having," "containing," "involving," and the like are to be understood to be open-ended, that is, to mean including but not limited to.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described preferred embodiments are intended to illustrate the principles of the invention, but not to limit the scope of the invention. Various other embodiments and modifications to these preferred embodiments may be made by those skilled in the art without departing from the scope of the present invention.

The invention claimed is:

1. A filter system for cleaning the air of an enclosure to be ventilated, the enclosure including a ventilation opening and being associated with an insertion shaft located proximate to the ventilation opening, the filter system including:
   (a) a filter housing for accommodating at least one filter element, the filter housing being configured so as to cover the ventilation opening when the filter housing is in an end position;
   (b) a thrust element for exerting a thrust upon the filter housing in a first direction to displace the filter housing in the first direction through an opening of the insertion shaft and along the insertion shaft to an initial inserted position along the insertion shaft, and for exerting an additional thrust upon the filter housing in the first direction after the filter housing has reached the initial inserted position;
   (c) at least one guide element located at a back portion of the insertion shaft spaced apart from the opening of the insertion shaft, the at least one guide element for contacting a leading edge of the filter housing after the filter housing has been inserted to the initial inserted position so that such contact displaces the filter housing to the end position in response to the additional thrust exerted upon the filter housing by the thrust element, the displacement to the end position including a displacement of at least a portion of the filter housing in a second direction extending perpendicular to the first direction; and
(d) an adjusting bar pivotally connected at a first end to the thrust element and pivotally connected at an opposite end to the filter housing.

2. The filter system of claim 1 wherein the filter housing has an essentially planar shape and the filter housing in the end position resides substantially parallel to the orientation of the filter housing in the initial inserted position.

3. The filter system of claim 1 wherein the filter housing moves in substantially a translatory fashion from the initial inserted position to the end position.

4. The filter system of claim 1 further including an additional adjusting bar pivotally connected at a first end to the thrust element and pivotally connected at an opposite end to the filter housing, wherein the two adjusting bars are spaced apart at a leading end of the filter housing.

5. The filter system of claim 4 further including two trailing end adjusting bars spaced apart at a trailing end of the filter housing, each trailing end adjusting bar being pivotally connected at a first end to the thrust element and pivotally connected at an opposite end to the filter housing.

6. The filter system of claim 1 wherein the at least one guide element includes a ramp located so as to contact the filter housing as it moves in the first direction.

7. The filter system of claim 1 further including a stop which is spaced apart from the plane of a rear wall of the insertion shaft and positioned so as to limit the motion of the filter housing in the first direction.

8. The filter system of claim 1 wherein the filter housing is locked in the end position.

9. The filter system of claim 1 wherein the dimension of the insertion shaft in the second direction is smaller than the distance between the inserting position and the end position in the second direction.

10. A switchgear cabinet or subrack carrier including:
(a) an enclosure including a ventilation opening;
(b) an insertion shaft located at a side of the enclosure which includes the ventilation opening;
(c) a filter housing for accommodating at least one filter element, the filter housing being configured so as to cover the ventilation opening when the filter housing is in an end position;
(d) a thrust element for exerting a thrust upon the filter housing in a first direction to displace the filter housing in the first direction along the insertion shaft to an initial inserted position along the insertion shaft, and for exerting an additional thrust upon the filter housing in the first direction after the filter housing has reached the initial inserted position;
(e) transverse displacement means located in the insertion shaft for contacting a leading edge of the filter housing so as to displace the filter housing from the initial inserted position to the end position in response to the additional thrust exerted upon the filter housing by the thrust element, the displacement from the initial inserted position to the end position including a displacement of at least a portion of the filter housing in a second direction extending perpendicular to the first direction; and
an adjusting bar pivotally connected at a first end to the thrust element and pivotally connected at an opposite end to the filter housing.

11. The switchgear cabinet or subrack carrier of claim 10 wherein the insertion shaft is located underneath the enclosure.

12. The switchgear cabinet or subrack carrier of claim 10 wherein the filter housing has an essentially planar shape and the filter housing in the end position resides substantially parallel to the orientation of the filter housing in the initial inserted position.

13. The switchgear cabinet or subrack carrier of claim 10 wherein the filter housing moves in substantially a translatory fashion from the initial inserted position to the end position.

14. The switchgear cabinet or subrack carrier of claim 10 further including at least one additional adjusting bar pivotally connected at a first end to the thrust element and pivotally connected at an opposite end to the filter housing.

15. The switchgear cabinet or subrack carrier of claim 10 wherein the transverse displacement means includes a ramp located so as to contact the filter housing as it moves in the first direction.

16. The switchgear cabinet or subrack carrier of claim 10 further including a stop which is positioned so as to limit the motion of the filter housing in the first direction.

17. A method for positioning a filter housing in an end position with respect to a ventilation opening of an enclosure to be ventilated, the end position comprising a position in which the filter housing covers the ventilation opening of the enclosure so that air must pass through a filter element associated with the filter housing in order to reach the interior of the enclosure, the method including:
(a) exerting a first thrust upon the filter housing in a first direction, the first thrust displacing the filter housing in the first direction along an insertion shaft to an initial inserted position along the insertion shaft;
(b) exerting an additional thrust upon the filter housing in the first direction after the filter housing has reached the initial inserted position, the additional thrust displacing the filter housing further in the first direction from the initial inserted position;
(c) in response to the additional thrust, displacing the filter housing to the end position, the displacement to the end position including a displacement of at least a portion of the filter housing in a second direction extending perpendicular to the first direction, and the displacement in the second direction being effected by contact between the filter housing and a separate guide element within the insertion shaft; and
(d) pivoting at least one adjusting bar as the filter housing is displaced to the end position, the at least one adjusting bar being pivotally connected at a first end to a thrust element by which the first thrust and the additional thrust are applied to the filter housing and being pivotally connected at an opposite end to the filter housing.

18. The method of claim 17 wherein the first thrust and the additional thrust are both applied through a thrust element connected to the filter housing.

19. The method of claim 17 wherein the guide element includes a ramp located within the insertion shaft to contact a leading edge of the filter housing as the filter housing is displaced further along the insertion shaft from the initial inserted position.

* * * * *